US008325933B2

(12) United States Patent
Melchior et al.

(10) Patent No.: US 8,325,933 B2
(45) Date of Patent: Dec. 4, 2012

(54) DEVICE AND METHOD FOR GENERATING AND PROCESSING SOUND EFFECTS IN SPATIAL SOUND-REPRODUCTION SYSTEMS BY MEANS OF A GRAPHIC USER INTERFACE

(75) Inventors: Frank Melchior, Erfurt (DE); Jan Langhammer, Ilmenau (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 1432 days.

(21) Appl. No.: 11/934,515

(22) Filed: Nov. 2, 2007

(65) Prior Publication Data

US 2008/0101616 A1 May 1, 2008

Related U.S. Application Data

(63) Continuation of application No. PCT/EP2006/003709, filed on Apr. 21, 2006.

(30) Foreign Application Priority Data

May 4, 2005 (DE) ......................... 10 2005 021 378
Sep. 13, 2005 (DE) ......................... 10 2005 043 641

(51) Int. Cl.
*H03G 3/00* (2006.01)

(52) U.S. Cl. ........................................... 381/63; 381/61

(58) Field of Classification Search .................... 381/17, 381/18, 61, 63; 345/156; 715/701, 702, 715/727–729
See application file for complete search history.

(56) References Cited

U.S. PATENT DOCUMENTS

| | | | |
|---|---|---|---|
| 5,812,674 A | 9/1998 | Jot et al. | |
| 6,747,678 B1 * | 6/2004 | Katayama et al. | 715/773 |
| 7,751,574 B2 * | 7/2010 | Kushida | 381/63 |
| 2003/0007648 A1 | 1/2003 | Currell | |
| 2003/0152237 A1 | 8/2003 | Nielsen | |

FOREIGN PATENT DOCUMENTS

DE 196 34 155 A1 2/1997

(Continued)

OTHER PUBLICATIONS

Author: S. Spors et al. Tittle: High Quality Acoustic Rendering with Wave Field Synthesis. Dated: Nov. 2002. Publisher: University of Erlangen-Nuremberg.*

(Continued)

*Primary Examiner* — Devona Faulk
*Assistant Examiner* — David Ton
(74) *Attorney, Agent, or Firm* — Glenn Patent Group

(57) ABSTRACT

The present invention is based on the finding that a sound-reproduction system, which can generate a spatial sound impression in a reproduction environment, can be efficiently and intuitively controlled by means of a graphic user interface when an impulse response associated with a spatial direction with respect to the reproduction environment is graphically represented, and when the possibility is created for a user to change the impulse response graphically so that, based on the user input of a change, the changed impulse response can be graphically represented and the changed graphical representation can be detected, in order to control the sound-reproduction system. Since it is system-theoretically possible to describe all known linear signal processing operations by impulse responses, it is possible, with the inventive graphic user interface, to provide a sound mixer, through a graphical representation, with an intuitive access to sound effects depending on the direction.

17 Claims, 10 Drawing Sheets

REPRESENTATION OF SPATIAL IMPULSE RESPONSES IN A TIME-FREQUENCY REPRESENTATION

HEIGHTS OVER SURFACE REPRESENT FUNCTION VALUES

FOREIGN PATENT DOCUMENTS

| | | |
|---|---|---|
| GB | 2 367 409 | 6/2001 |
| WO | WO2004/047485 | 6/2004 |
| WO | WO 2005/036523 | 4/2005 |

OTHER PUBLICATIONS

Author: Vorm. Title: Transform Coding of Audio Impulse Response. Aug. 2003. Self Published. Thesis Paper.*

Author: Caulkins et al. Tittle: WFS Interaction with the listening environment, improvements in the reproduction of virtual sources situated inside the listening room. Dated: Sep. 2003. Publisher: DAFX-03.*

"Rendering of Advanced 3D Room Model" by Simeonov et al., 114th AES Convention Mar. 2003, Amsterdam.*

"User Interaction and Authoring of 3D Sound Scenes in the CARROUSO EU project" by Vaananen, 114th AES Convention Mar. 2003, Amsterdam.*

"High quality acoustic rendering with Wave Field Synthesis" by Spors et al, Nov. 2002.*

Software for the simulation, performance analysis and real-time implementation of Wave Field Synthesis system for 3D-audio by Sergio Bleda et al, DAFX-03, Sep. 2003.*

Anonymous: "Surround reverb for Steinberg's Nuendo"Internet Aticle, Online May 30, 2004, XP002419472.

Berkhout, A.J.; de Vries, D.; Vogel, P.: Acoustic control by Wavefield Synthesis. JASA 93, 1993).

Diemer de Vries, "Sound Reinforcement by Wavefield Synthesis: Adaption of the Synthesis Operator to the Loudspeaker Directivity Characteristics", Delft University of Technology Laboratory of Seismics and Acoustics, Journal of J. Audio Eng. Soc., Bd. 44, Nr. 12, Dec. 1996.

M.M. Boone, E.N.G. Verheijen, P.F. v. Tol, "Spatial Sound-Field Reproduction by Wav-Field Synthesis", Delft University of Technology Laboratory of Seismics and Acoustics, Journal of J. Audio Eng. Soc., Bd. 43, No. 12, Dec. 1995.

Theile G, Wittek H, Reisinger M: "Potential Wavefield Synthesis Applications in the Multichannel Stereophonic World" Proceedings of the AES 24$^{th}$ International Conference: Multichannel Audio, Jun. 26-28, 2003, Feb. 2004 XP002419473.

* cited by examiner

REPRESENTATION OF SPATIAL IMPULSE RESPONSES
IN A TIME-FREQUENCY REPRESENTATION

HEIGHTS OVER SURFACE REPRESENT FUNCTION VALUES

DEVICE AND METHOD FOR GENERATING AND PROCESSING SOUND EFFECTS IN SPATIAL SOUND-REPRODUCTION SYSTEMS BY MEANS OF A GRAPHIC USER INTERFACE

CROSS-REFERENCE TO RELATED APPLICATIONS

This application is a continuation of copending International Application No. PCT/EP2006/003709, filed Apr. 21, 2006, which designated the United States and was not published in English.

TECHNICAL FIELD

The present invention relates to modern audio technologies and in particular to the generation and processing of spatial sound impressions for sound-reproduction systems.

BACKGROUND

In modern sound-reproduction systems can be achieved, through using several loudspeakers, that individual sound sources can be accurately localized in the space and that within the reproduction environment is produced the impression that one is within a simulated area, e.g. a stadium or a cathedral. Two different reproduction concepts can in principle be distinguished. In the conventional surround reproduction, also usual in the field of home entertainment, the localisation and spatial information is already mixed during the sound mixing operation into individual channels to be transferred discretely, a reproduction system comprised of several loudspeakers being used for reproducing the individual channels. The reproducing loudspeakers should be located at a predetermined position with respect to the reproduction environment, in order to achieve an optimum spatial impression.

More advanced systems, such as the space simulations based on wave-field synthesis, generate the control signals for the individual loudspeakers only during the reproduction, based on position information of a sound source with respect to the reproduction room and the spatial information of a reproduction environment to be simulated. Substantially more authentic results can thus be achieved as regards the localisation and the spatial impression, since the individual loudspeaker setup here can be taken into consideration during the reproduction, in order to generate in the reproduction environment a wave-front, which best represents the spatial impression to be simulated.

For a better understanding of the present invention, the wave-field synthesis technique will now be described more in detail.

A better natural spatial impression as well as a stronger enveloping during audio reproduction can be achieved by means of a new technology. The bases for this technology, the so-called wave-field synthesis (WFS; WFS=Wave-Field Synthesis), have been investigated at the Delft TU and presented for the first time in the late 80's (Berkhout, A. J.; de Vries, D.; Vogel, P.: Acoustic control by Wave-field Synthesis, JASA 93, 1993).

Due to the huge requirements of this method as regards computer power and transmission rates, the wave-field synthesis has, until now, only very seldom been used in practice. Only the progresses in the fields of the microprocessor technique and the audio coding now permit using this technology in concrete applications.

The basic idea of WFS is based on the application of the Huygens principle of the wave theory:

Each point detected by a wave is the starting point of an elementary wave, which spreads spherically and/or in a circular way.

Applied to the acoustics, by a large number of loudspeakers, which are arranged next to each other (a so-called loudspeaker array), can be reproduced any form of incoming wave-front. In the simplest case, of one punctual source to be reproduced and a linear arrangement of the loudspeakers, the audio signals of each loudspeaker must be supplied with a time delay and an amplitude modulation such that the radiated sound fields of the individual loudspeakers properly overlap. In the case of several sound sources, the contribution to each loudspeaker is calculated separately for each source and the resulting signals are added. If the sources to be reproduced are located in a virtual room with reflecting walls, the reflections must also be reproduced as additional sources by the loudspeaker array. Therefore, the complexity of the calculation strongly depends on the number of sound sources, the reflection properties of the room and the number of loudspeakers.

The advantage of this technique resides in particular in that a natural spatial sound impression is possible over a large area of the reproduction room. In contrast to the well-known techniques, the direction and distance of the sound sources are reproduced very accurately. To a limited extent, virtual sound sources can even be positioned between the real loudspeaker array and the listener.

The wave-field synthesis thus permits a correct reproduction of virtual sound sources over a large reproduction area. At the same time, it provides the sound mixer and sound engineer with new technical and creative potential also when creating complex sound landscapes. The wave-field synthesis (WFS or also sound-field synthesis), as it was developed in the 80's at the Delft TU, represents a holographic approach of the sound reproduction. The Kirchhoff-Helmholtz integral serves as a basis. This means that arbitrary sound fields can be generated within a closed volume by means of a distribution of monopole and dipole sound sources (loudspeaker arrays) on the surface of this volume. Details hereof can be found in M. M. Boone, E. N. G. Verheijen, P. F. v. Tol, "Spatial Sound-Field Reproduction by Wave-Field Synthesis", Delft University of Technology Laboratory of Seismics and Acoustics, Journal of J. Audio Eng. Soc., vol. 43, no. 12, December 1995 and Diemer de Vries, "Sound Reinforcement by Wavefield Synthesis: Adaptation of the Synthesis Operator to the Loudspeaker Directivity Characteristics", Delft University of Technology Laboratory of Seismics and Acoustics, Journal of J. Audio Eng. Soc., vol. 44, no. 12, December 1996.

In the wave-field synthesis, a synthesis signal for each loudspeaker of the loudspeaker array is calculated from an audio signal, which is sent by a virtual source at a virtual position, the synthesis signals being formed, as regards their amplitude and phase, so that a wave, which results from the overlapping of the individual sound waves output by the loudspeaker present in the loudspeaker array corresponds to the wave, which would proceed from the virtual source at the virtual position if this virtual source at the virtual position were a real source with a real position.

Several virtual sources are typically present at different virtual positions. The calculation of the synthesis signals is performed for each virtual source at each virtual position, so that a virtual source typically results into synthesis signals for several loudspeakers. Viewed from a loudspeaker, this loudspeaker thus receives several synthesis signals, which proceed from different virtual sources. An overlapping of these sources, which is possible due to the principle of linear superposition, then results into the reproduction signal actually sent by the loudspeaker.

The possibilities of the wave-field synthesis can be best exhausted as the loudspeaker arrays are closer, i.e. the more individual loudspeakers are arranged as close as possible to each other. In this way, however, the calculation performance necessitated from a wave-field synthesis unit also rises, since channel information must typically also be taken into consideration. This means in particular that an own channel is, in principle, present from each virtual source to each loudspeaker, and that it can happen, in principle, that each virtual source leads to a synthesis signal for each loudspeaker, or that each loudspeaker receives a number of synthesis signals, which is equal to the number of virtual sources.

Furthermore, it should be pointed out here that the quality of the audio reproduction increases with the number of loudspeakers made available. This means that the more loudspeakers are present in the loudspeaker array or arrays, the better and more realistic the audio reproduction quality becomes.

Spatial sound-reproduction systems such as the wave-field synthesis thus allow generating the sound within 360 degrees around the auditorium with optimal spatial resolution. Until now, these systems were used essentially for positioning discrete sound sources and for direct sound reproduction. To the signals of the sound sources thus generated can, in addition, be applied all well-known linear signal processing operations, such as e.g. adding reverberation. In spatial sound-reproduction systems such as wave-field synthesis (WFS), it is furthermore possible to generate spatial effects based on the direct sound. This occurs for example in space simulation, wherein the reproduction can, for efficiency reasons, be simplified to a limited number of spatial directions (plane waves).

In a very simple case of space simulation, identical parameters are used for describing the room for all spatial directions (diffuse reverberation) and space portions depending on the direction (early reflections) are generated automatically. Generating spatial effects is judicious not only when natural spatial effects are to be reproduced, since the basic possibilities of this kind of signal processing can also be used in other creative ways.

In wave-field synthesis, a room to be provided with sound is provided with sound by as many individual loudspeakers as possible, in order to permit the reconstruction of wave-fronts with optimum accuracy. For orientating the sound signals and generating a spatial impression, there are usually used a plurality of parameters, which are to be determined for each loudspeaker individually during downmixing of the sound signal.

As described above, the multi-channel sound-reproduction systems are characterised by an extraordinarily high complexity, so that the additional generation of spatial information or orientation information during downmixing of the sound necessitates generating a plurality of parameters, which describe for each loudspeaker individually the orientation information or additional linear signal processing steps (for generating sound effects). This description by means of a plurality of abstract mathematical parameter without any directly and intuitively detectable meaning is difficult to be controlled, in particular in wave-field synthesis systems.

For example, wave-field synthesis provides the possibility of freely positioning sound sources on a two-dimensional listening level. This occurs through synthesizing different wave-fronts depending on the position of the sound sources. User surfaces, such as they are presently used, use a point in a plane view of the two-dimensional listening level for positioning the sound source, the point representing the position of the sound source. Since in this approach the spatial position of the sound source is of course sufficiently visualised, but the sound-depth impression (spatial impression) can, in principle, however not be represented simultaneously in the visualisation, discrepancies occur between the real perception and the representation, so that only in a few exceptional cases a visual picture is available, which corresponds to the real sound impression or permits to conclude same.

SUMMARY

According to an embodiment, a graphic user interface for a sound-reproduction system, which is formed so as to generate in a reproduction environment a spatial sound impression, may have: a display for graphically displaying impulse responses, which are associated with spatial directions of the reproduction environment, the impulse responses, relative to the reproduction environment, being represented in the spatial directions they are allocated to; an input device for allowing changing the graphical display of the impulse responses by the user, a change of the graphical display of the impulse responses being enabled at predetermined points; a receiver for receiving a user input of a change, in order to graphically represent a changed impulse responses by the display; and a detector for detecting the changed impulse responses.

According to another embodiment, a controlling apparatus for a sound-reproduction system, which is formed so as to generate a spatial sound impression in a reproduction environment, may have: the above graphic user interface for a sound-reproduction system; and a signal generator for providing loudspeaker signals for loudspeakers of a plurality of loudspeakers that can be placed at different spatial positions.

According to another embodiment, a method for using a sound-reproduction system, which is formed so as to generate a spatial sound impression in a reproduction environment, may have the steps of: graphically displaying impulse responses associated with spatial directions of the reproduction environment, the impulse responses, relative to the reproduction environment, being represented in the spatial directions they are allocated to; allowing changing the graphical display of the impulse responses by the user, a change of the graphical display of the impulse responses being enabled at predetermined points; receiving a user input of a change, in order to represent changed impulse responses; and detecting the changed impulse responses.

According to another embodiment, a method for controlling a sound-reproduction system may have the steps of the above method for using a sound-reproduction system and additionally the step of: providing loudspeaker signals for a plurality of loudspeakers, which can be placed at different spatial positions based on the changed impulse responses.

Another embodiment may have: a computer program with a program code for performing the above method for using a sound-reproduction system or the above method for controlling a sound-reproduction system when the computer program is executed on a computer.

The present invention is based on the finding that a sound-reproduction system, which can generate a spatial sound impression in a reproduction environment can be efficiently and intuitively controlled by means of a graphic user interface, when an impulse response associated with a spatial direction regarding the reproduction environment or a graphical representation obtained from the graphical representation is represented graphically and when the possibility is created that a user can graphically change this representation so that, based on the user input of the change, the changed impulse response can be represented as well as the changed graphical representation can be detected, in order to control the sound-reproduction system.

Since it is theoretically possible with the system to describe all known linear signal processing operations by impulse responses, it is possible with the graphic user interface according to the invention to provide a sound creator, through a graphical representation, with an intuitive access to the sound effects depending on the direction, in order to thus increase the efficiency and the quality during the control of the sound-reproduction system.

Through aliasing an original signal with impulse responses, all linear signal processing algorithms can be represented. As an example, in a room simulation based on wave-field synthesis, the signals for plane waves can thus be generated through aliasing with the corresponding spatial impulse responses associated with the corresponding spatial directions. In this way, spaces can also be reproduced, the used impulse responses being, according to the invention, also directly visualised besides a description by the parameters on which they are based. The new sound-creating tool according to the invention consists of a simultaneous visualisation of all impulse responses depending on the direction corresponding to a source. The sound creation occurs through direct interaction with this visualisation. The processing of the visual representation is converted into a parametric description and from the latter are generated the associated impulse responses.

The direction information or a spatial nature is thus imparted to a sound signal by a mathematical aliasing with an impulse response, which will now be briefly explained in order to better understand the core of the invention.

A spatial impression or a reflection pattern or localisation information is imparted to a sound signal f(y) through aliasing with an impulse response g(x), so that the combined sound signal F(x) is obtained according to the following aliasing integral:

$$F(x) = \int_{-\infty}^{\infty} f(y)g(x-y)dy.$$

The impulse response g(x) generally describes the answer of a system to a Dirac impulse δ(x), thus an impulse of an infinitesimal length to which applies:

$$\int_{-\infty}^{\infty} \delta(x)dx = A.$$

Thus, this means that an ideal Dirac impulse is characterised by an infinitesimal length and, in addition, in that its integral, as described above, is finite. In the case of a sound signal, this means that a Dirac pulse is arbitrarily small, but carries however a fixed acoustic energy.

If we test a room with a Dirac pulse, we obtain as the simplest impulse response again a Dirac pulse, which is recorded with a propagation delay t with respect to the sending of the test pulse at the location of sending of the test pulse. This is exactly the case when in the direction in which the test pulse was emitted is located an ideal reflector, which reflects the acoustic test signal without attenuation, the propagation time between the location of sending of the source and the reflector being then exactly t/2.

It should be noted here that, in practice, it is impossible to generate an ideal Dirac pulse, instead, from now on, pulses the width of which is finite and the intensity of which is A are also called Dirac pulses.

As an illustration, one can imagine such real impulses for example from Gaussian-shaped small-width curves with a surface content A.

If the above-described reflector would absorb part of the acoustic energy, thus attenuate the test signal, the reflected Dirac pulse received after the propagation time t would have a smaller surface B under the curve than the original pulse (B<A).

Besides the idealised simple cases of an impulse response described so far, it is possible furthermore to obtain arbitrarily complex impulse responses. For example, if two reflectors are located at distances differing from each other, which correspond to the acoustic propagation times $t_1$ and $t_2$, with respect to the location of sending of the test signal, the impulse response will consist of two Dirac pulses received at the times $2*t_1$ and $2*t_2$. Acoustic scenes are normally very complex, so that a real impulse response will be a succession of pulses becoming denser over the time, which begins with early reflections and the components of which arriving later in time describe for example a reverberation.

As explained above, an impulse response describes in the form of a Dirac pulse a delay or an echo. Likewise, for example a multiple echo can be represented by a sum of Dirac-shaped pulses. For a realistic space simulation, the impulse response, which is aliased with the sound signal will generally be continuous, e.g. a signal strongly rising at the time to and then vanishing softly, which describes a multiple reflection, the signals reflected at later times being more strongly attenuated.

In real scenarios, the sound signals are in addition frequency-selectively attenuated, for example high sound signals from carpets and wall coverings are more strongly attenuated than low sound signals. In order to cope with these circumstances, for example different impulse responses can be used and visualised separately for several frequency ranges or the visualisation of the impulse response must include the time and the frequency range.

In another exemplary embodiment of the present invention, the graphic user interface is used to represent the spatial position of a sound source with respect to the sound-reproduction system and to visualise the resulting impulse responses, which represent for each loudspeaker of a reproduction system individually the spatial orientation of the sound signal with respect to the reproducing loudspeaker.

The user can clearly graphically change the position of the source with respect to the reproduction environment, from the represented wave-front of the punctual acoustic signal source being automatically obtained the impulse response of the individual loudspeakers or the parameters for the control of the loudspeakers. A sound engineer has thus the possibility of intuitively generating the complex parameters, which are necessitated for controlling the sound-reproduction system.

A substantial aspect is that there is in addition created the possibility of directly changing the impulse responses, through a graphical interaction with the user interface, the way in which the present change affects the perception of the position of the sound source being directly represented. With the graphic user interface according to the invention, one can thus advantageously chose whether one wants to directly place the sound source based on the physical reality or whether one would like to creatively use the possibilities of changing the impulse response. In the latter case, one obtains, in addition, an estimation of how the manual change of the impulse responses is interpreted in the perception of a listener. A sound engineer can thus chose between two possibilities of visually processing the sound and follow the approach that is most advantageous for the desired sound result or the spatial sound impression, which has to be achieved.

In another exemplary embodiment of the present invention, the graphic user interface according to the invention is used for representing impulse responses, which contain information about a space to be simulated. The display means represents the impulse responses with respect to a fixed point within the reproduction environment in the spatial directions for which they also carry the spatial information.

Thus, the display means represents simultaneously all the data (impulse responses) relevant for the total spatial impression, the latter being visualised as a three-dimensional image of the environment. A user thus has the advantage of receiving at the same time all the information regarding the spatial sound impression or of being able to change them simultaneously, whereby the modified spatial sound impression can be represented and estimated at any time.

It is thus possible to intuitively obtain a sound impression with reverberation or desired attenuations and other signal manipulations without having to manually change the underlying parameters for the impulse responses, which necessitates a considerable quantity of abstraction.

The graphical representation permits, furthermore, to perform the design process independently from technical basic conditions. Thus, an impulse-response function will generally be stored discretely, i.e. an associated amplitude value exists for discrete time segments. This must not be taken into consideration during the intuitive use of the graphic user interface, since the relevant parameters are automatically generated based on a graphical change of the displayed impulse response.

Another advantage resides in that the complexity of a system can easily be increased, without the intuitivity of the operation under the increased number of parameters being reduced.

In another exemplary embodiment of the present invention, it is possible to represent or process the impulse responses regarding several spatial directions in a frequency-selective way. It is thus possible to further increase the naturalness of the spatial impression by adopting for example different attenuation profiles according to the frequency for different spatial directions, which on the one hand increases the authenticity of the sound impression achieved, on the other hand however causes an increase of the complexity of the generation of the parameters. In the visual representation it is nevertheless possible to predict the sound experience that can be achieved and, in addition, to creatively change it by introducing, for example at a determined frequency for a freely selectable spatial direction, a high artificial attenuation. These changes are immediately visible and it is possible to reliably predict, within the context of the whole system, the influence on the total sound phenomenon.

In a simple example, identical parameters can be used for describing the room for all spatial directions, which corresponds to a diffuse reverberation. Space portions depending on the direction (early reflections) are applied only afterwards. This results into a specific spatial impulse response for each spatial direction, an undesired deviation from the parameters for a spatial direction can immediately be identified and corrected.

Another advantage of the three-dimensional representation according to the invention resides in that the frequency-selective impulse-response representation for each direction can easily be transposed through a simple scanning into a matrix representation the further processing of which is possible in an extraordinarily efficient way.

In another exemplary embodiment of the present invention, delay times are individually set for a given number of spatial directions, the delay times being represented as Dirac-shaped impulse responses. The latter are represented with respect to a fixed point in the reproduction environment in a three-dimensional view. It is particularly advantageous that the graphical manipulation, which permits shifting the Dirac-shaped impulse responses with respect to a reference point, directly visually reflects the spatial effect. The Dirac-shaped impulse responses corresponding to a delay describe, as a matter of fact, a reflection at an object, increasing the distance of the impulse response with respect to the reference point in the graphical representation corresponding to increasing the propagation time of the reflected signal. Since the graphical representation directly corresponds to the simulated reality, e.g. spaces in which is located the reproduction environment can thus be simulated in the most efficient way.

A particular advantage of this simplified type of space arrangement is the high intuitivity of the representation and the related reduced error probability during the control of a sound-reproduction system.

In another exemplary embodiment of the present invention, the graphic user interface is operated for a sound-reproduction system with a signal generator, which generates loudspeaker signals for a plurality of loudspeakers arranged at different spatial positions. The high intuitivity and ease of use of the graphic user interface permits to manipulate the reproduction of signal sources also in real time so that the acoustic orientability of a sound signal, for example a singer on the stage, coincides with the optical impression. In this case, it is only necessary to adjust the moved sound source within the graphic user surface according to the invention, which could not be performed by means of a classical input of the parameters for a loudspeaker system to be controlled.

BRIEF DESCRIPTION OF THE DRAWINGS

Embodiments of the present invention will be detailed subsequently referring to the appended drawings, in which.

DETAILED DESCRIPTION

Figure 1:
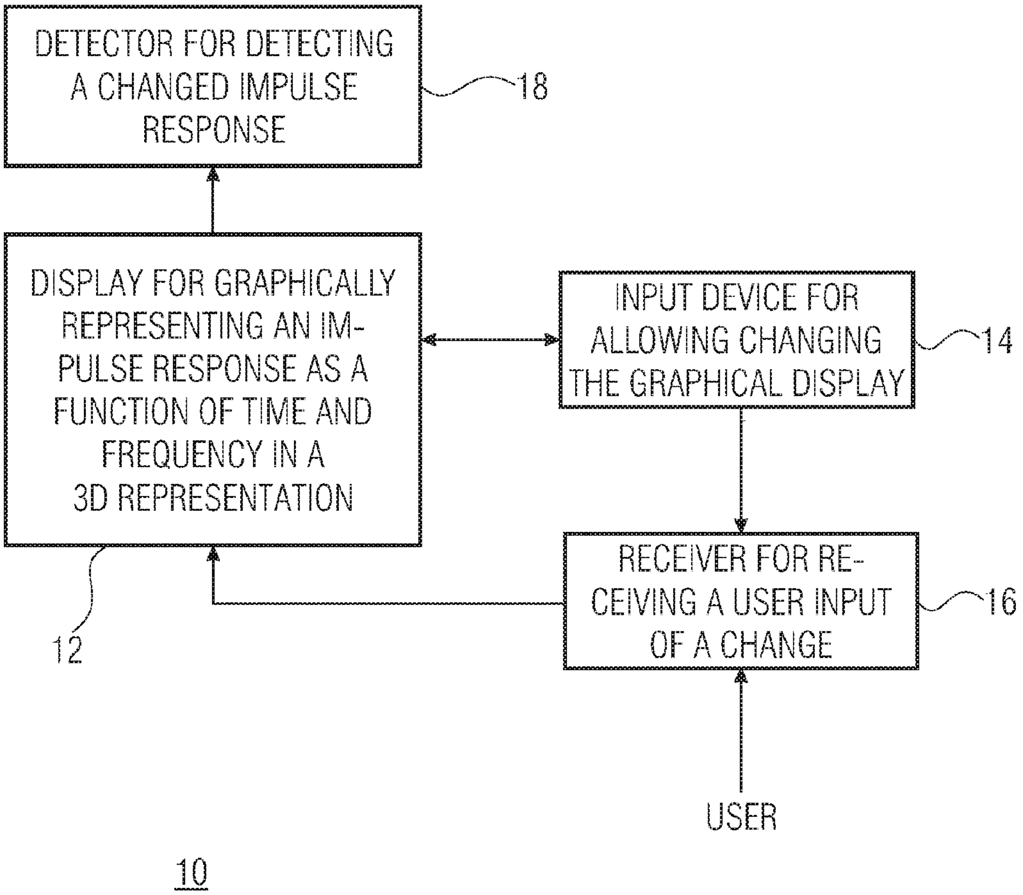
FIG. 1 is a block diagram for explaining the operation of the graphic user interface.

FIG. 1 shows in a block diagram the operation of a graphic user interface according to the invention 10, which has display means 12 for graphically displaying an impulse response, means for allowing changing the graphical display 14, means for receiving a user input of a change 16 and means for detecting the modified impulse response 18.

The display means 12 represents the impulse responses graphically prepared for the user so that the effects of a change of the represented impulse responses can be intuitively interpreted and predicted.

The means for allowing changing the graphical display 14 has access to the display means 12 and the data it visualises.

In order to allow changing the impulse responses, there is necessitated a user input, which is received by the means for receiving a user input of a change 16, whereby the change can occur for example by means of a computer mouse, a touch pad or interaction and visualisation techniques from systems for virtual reality.

Based on the user input of a change, the display means 12 can now graphically represent a changed impulse response.

Through the interaction between the display means 12, the means for allowing a change 14 and the means for receiving a user input of a change 16 an iterative change process starting from the user input and the following graphic updating becomes possible. This has the important advantage that the effect of a user input of a change can be directly controlled graphically or acoustically. An explicit execution of the changes and a successive control through a test audition within a sound-reproduction system can thus be omitted, which considerably contributes to cost and time saving.

The means for detecting the modified impulse response 18 detects the modified impulse response and stores it for example for further use. The possibility of storing the impulse response can advantageously be used for re-using for further projects an already generated impulse response, which describes a special space to be simulated.

Figure 2:
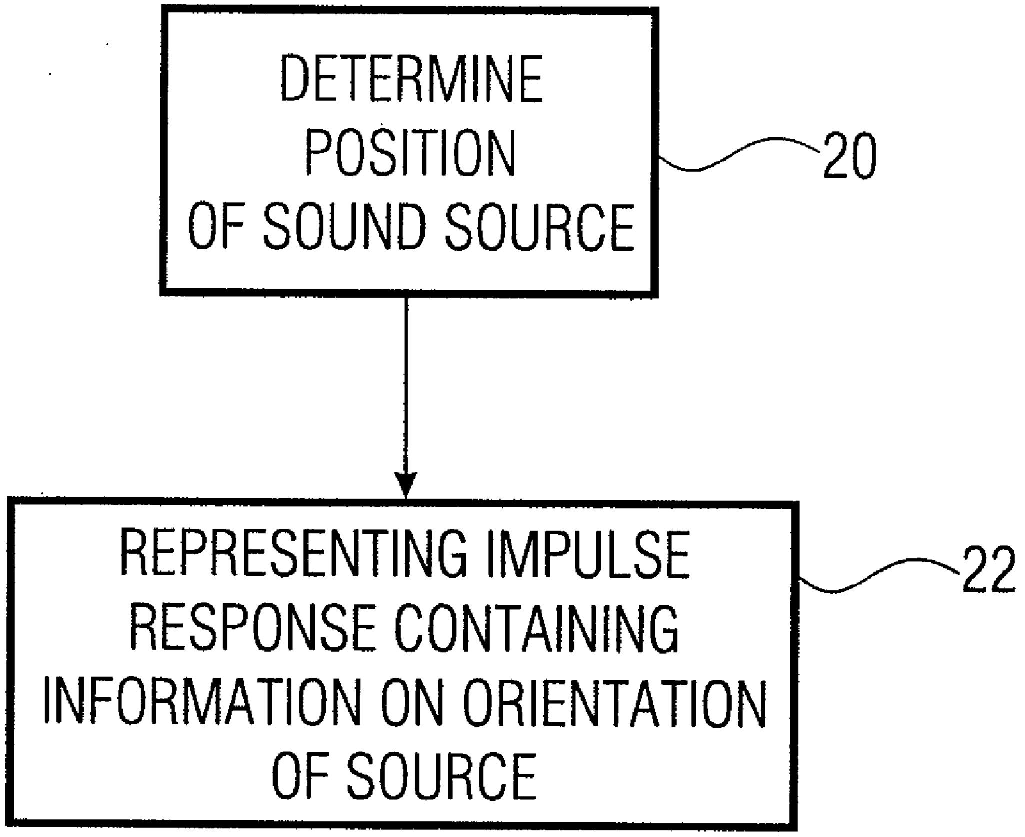
FIG. 2 is a block diagram for fixing and processing the position of sound sources.
Figure 3A:
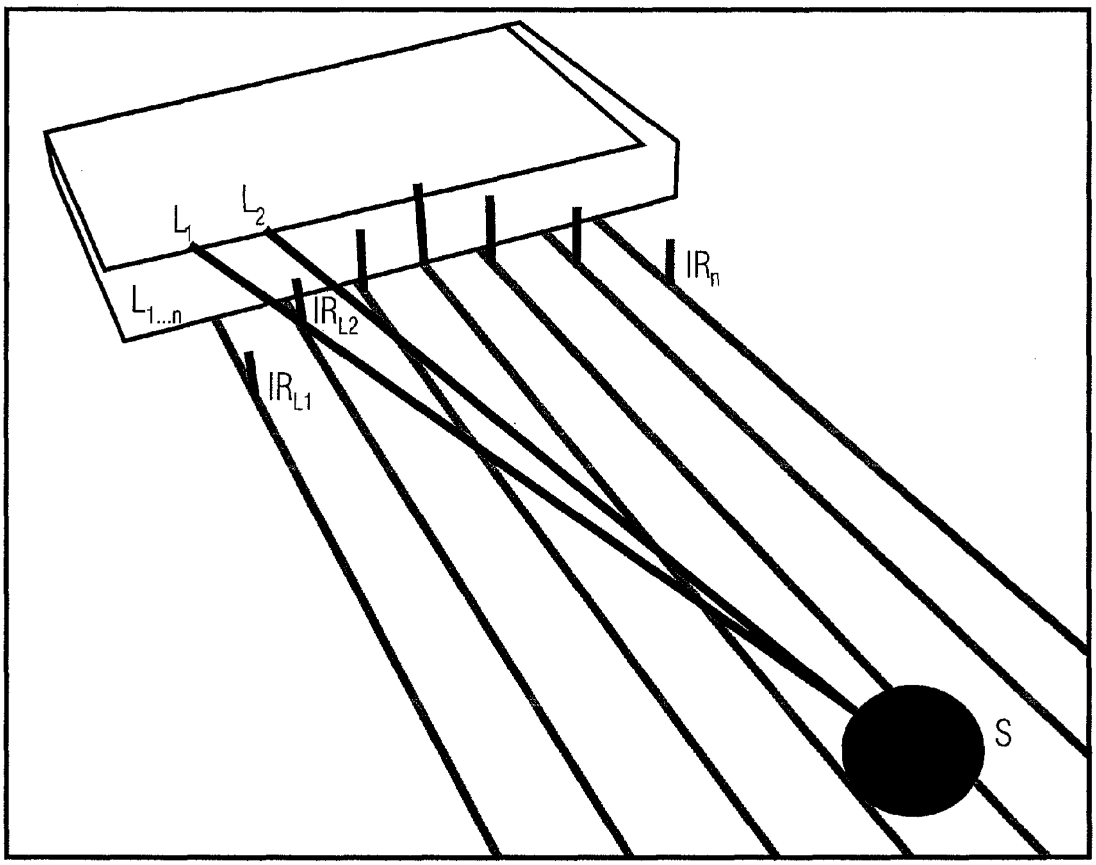
FIG. 3*a* shows an example of a graphic user interface for processing impulse responses of the parameters, which describe the location of a sound source.
Figure 3B:
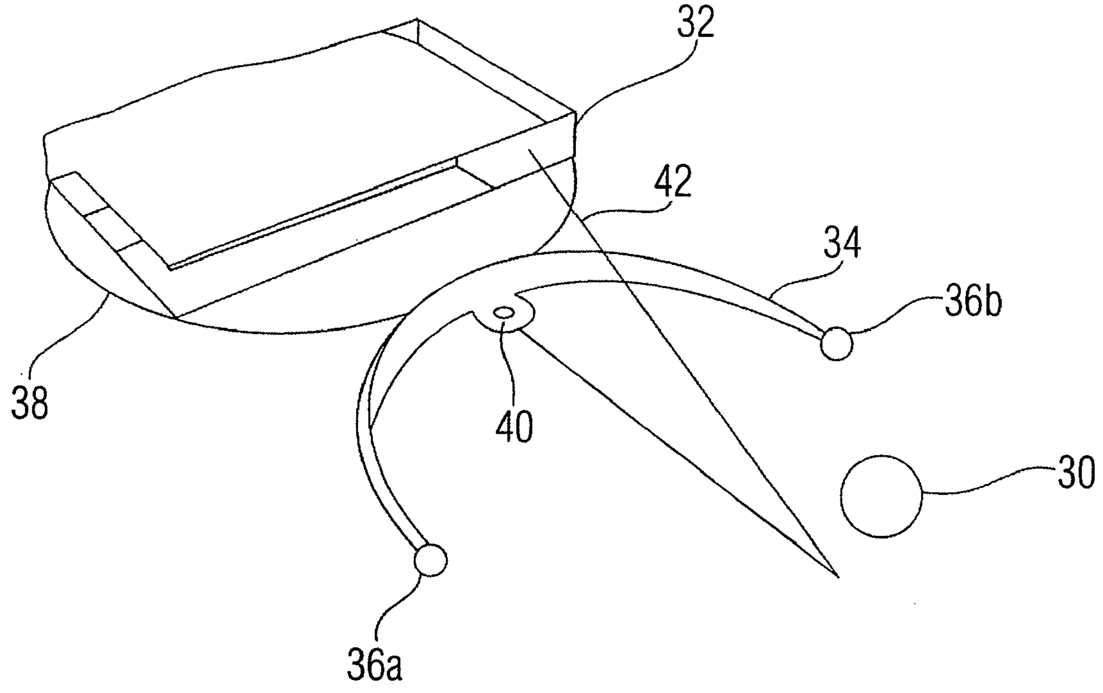
FIG. 3*b* shows another example of a graphic user interface.

It should be noted that different possibilities can be contemplated for visualising impulse responses. The simplest possibility is to arrange the impulse responses according to their direction about the centre of a reproduction system. In the represented resulting "mountain" can be performed a frequency-independent processing of the amplitude evolutions of the impulse responses. For examples of visualisation methods, reference is made to the following figures in which are described the following four variants of the visualisation:

wave-field synthesis punctual source
impulse-response time representation
impulse-response time-frequency representation
multi-tap delay FIG. 2 schematically shows how it is possible, based on the visualisation of the graphic user interface shown in FIG. 3*a* or 3*b*, to establish the position of a sound source by means of a graphic user interface according to the invention or to change an existing position so that a desired position impression is achieved.

In the positioning step 20, the position of a sound source with respect to the reproduction environment is first of all established graphically.

The graphic user interface graphically represents, in the second step 22, the impulse responses representing the position of the sound source, which can directly be changed by the user.

It should be noted that, as will be visible hereafter with reference to FIG. 3*a* or 3*b*, both the position of the source varies and the evolution of the calculated impulse responses can directly be manipulated. This allows, in addition, implementing creative sound effects which must not be directly coupled to "real" location information.

FIG. 3*a* or 3*b* shows an embodiment of a graphic user interface according to the invention for establishing the spatial position of a sound source or for changing the impulse responses representing the sound source.

A punctual sound source 30 in the form of a sphere, a reproduction environment 32 and a wave-front 34 corresponding to the punctual source are represented.

The position of the sphere describes the position of the sound source 30 in the room. Based on the position of the punctual source 30 is represented the wave-front 34, which results from the sound radiation of the punctual signal source. For example, if the punctual source 30 is moved to a point in the room, which is farther away from the reproduction environment 32, the wave-front 34 becomes flatter. If the punctual source 30 is moved closer to the loudspeaker system, the corresponding incoming wave-front will be more strongly curved.

According to the invention, the curvature of the wave-front can also be changed directly by means of two cursors 36*a* and 36*b*. This directly affects the perceived position of the punctual source 30, which is automatically represented by the graphic user interface according to the invention.

The graphic user interface in FIG. 3*a* or 3*b* shows furthermore a delay radius 38, which serves to avoid non-causal conditions during the reproduction of a system based on wave-field synthesis, the position of the wave-front 34 being determined by the delay radius. The delay radius 38 corresponds to a basic delay, which a wave-field synthesis system necessitates, and which corresponds to the distance of the loudspeaker farthest away from the centre of the system. Thanks to the basic delay, it is possible to position sources at will inside and outside the loudspeaker system/reconstruction area or the reproduction environment 32.

As shown in FIG. 3*a* or 3*b*, the position of the wave-front is defined by the intersection of the connecting line between the centre of the system and the position of the sound source 30 with the delay radius. The so determined position of the wave-front 34 is thus equivalent to a vanishing delay, since the delay radius 38 determines as a matter of fact the minimum delay period to be maintained. With the graphic user interface according to the invention, it is possible to position a sound source at will and to change its wave-front or the impulse response representing the wave-front.

As regards the propagation delays, it should be noted that the delay of a real sound field becomes, depending on the distance of the sound source from the listening room, a real signal propagation time. This is determined by the distance between the sound-source position and the centre of the reproduction system. When creating imaginary acoustic scenes, this propagation time is usually not desired, since it limits the possibilities of positioning the source, since for example time relationships during the recording of music can be changed. Therefore, this delay can be deactivated in wave-field synthesis systems, which can be necessary for an authentic sound impression. This important additional parameter is represented as circle 40 in the graphic user interface according to the invention, the position of the circle 40 on the connecting line between the centre of the system and the sound source 30 visualises the set delay.

In the case shown in FIG. 3*a* or 3*b*, the circle 40 is located directly at the limit of the delay radius 38, the represented propagation time has its lowest possible value, which corresponds to the basic delay of the wave-field synthesis system. If the case of a real sound propagation time/delay is to be reproduced, the position of the circle 40 would be located directly below the sphere representing the sound source 30, in which case all intermediate values can of course in addition be represented and adjusted. By means of the graphic user surface according to the invention, the important delay parameters can thus also be adjusted and changed intuitively, which further increases the freedom of formation and furthermore increases the efficiency of the design operation for the spatial sound reproduction.

The graphic user interface according to the invention has, in addition, the advantage of an extremely important flexibility, so that further parameters can easily be added, for example, the surface of the circle 40 could describe a relation between diffuse sound and direct sound, which is understood by a listener as another characteristic of the distance between a sound source and the listening position, whereby the modification of this relation could be implemented for example by displacing the circle 40 or changing its surface.

According to the position of a virtual sound source S with respect to the individual loudspeaker positions $L_{1 \ldots n}$, the wave-field synthesis algorithm calculates the impulse response $IR_{L1 \ldots Ln}$ for each loudspeaker involved (amplitude, delay). If we consider at a time t these impulse responses lined up in a row, the peaks result into a scanned version of the wave-front output by the virtual sound source. In another graphic process step (see FIG. 3*a*), the wave-front can thus be represented in a simplified way and be represented with interaction elements. If the user interacts with these elements, the graphical representation of the wave-front changes. In the next step, this change in representation can be imparted to the individual impulse responses $IR_{L1 \ldots Ln}$.

Generally speaking, through the graphic user interface is made possible the manipulation of impulse responses, which are advantageously to be calculated for each individual loudspeaker that delivers sound to be reproduction volume 32.

In the exemplary embodiment shown in FIG. 3*b*, the graphic user interface allows the manipulation of the impulse responses, which are to be calculated for each individual loudspeaker that delivers sound to the reproduction volume 32. The representation of the impulse responses results directly from the representation of the graphic user interface, for which a connecting line 42 between the sound source 30 and a contemplated loudspeaker at the edge of the reproduction volume 32 is represented by way of an example. The impulse response to be calculated is given directly by the form of the wave-front at the location at which the connecting line 42 intersects the wave-front 34. The spatial position of a sound source 30 is converted, as can be seen in FIG. 3*a* or 3*b*, for each individual loudspeaker into a time delay and an amplitude. The amplitude results directly from the height of the graphical representation of the wave-front 34, the time delay being also determined by the intersection of the straight line 42 with the wave-front 34, the length of the cut segments of the straight line 42 being decisive for the determination of the time delay.

Alternatively to the forms of manipulation already described, which are implemented in the graphic user interface, a series of further alternative scenarios are easy to be implemented.

Thus e.g. the wave-front representation 34 in the figure is limited by two spheres or cursors 36*a* and 36*b*. The manipulation of the wave-front at these points finally affects the time delays of the loudspeakers of the wave-field synthesis system involved by the synthesis. Further cursors on the represented wave-front 34 could be used for example for changing the loudspeaker amplitudes. Thus, the simple adjustment of a windowing in order to avoid marginal effects becomes possible as well as the definition of a point with maximum amplitude. This point can then provide the sound source with a frequency-independent directional characteristic, at least in relation to the intensity.

For the representation of the loudness of a sound source can be used for example the size of the sphere 30 describing the sound source. The above-mentioned manipulation of the direct sound/diffuse sound ratio can also be shown here. If the volume of the direct sound corresponds to the size of the sphere 30, e.g. a distant sound source is rather quieter and thus corresponds to a small sphere. A coupling with a distance-dependent calculation of the loudness of a sound source can thus be performed very easily by this representation.

With the graphic user interface according to the invention in FIG. 3*a* or 3*b*, it is thus possible to represent intuitively and in a generally understandable way the mathematical function, which embodies the impulse response, so that the impulse response can be manipulated according to the objective of obtaining a desired direction impression.

While the possibilities of the graphic user surface from FIG. 3*a* or 3*b* were related to the positioning of a sound source, thus to the determination of a sound impression, which reproduces the location of the sound source, it will be explained, with reference to FIG. 4-8, that the graphic user interface according to the invention is also suitable for visualising impulse responses, and for allowing their modification, which provide a sound impression that corresponds to that of a space to be simulated, such as for example a cathedral.

To allow this, there are two basic possibilities, which will be described hereafter with reference to FIGS. 4 and 5.

Figure 4:
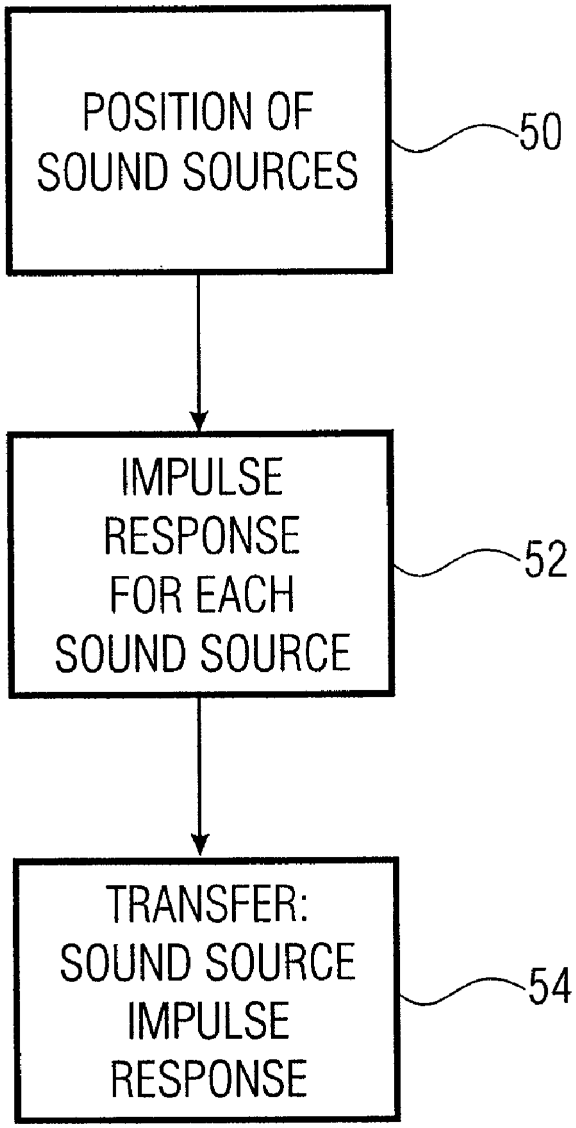
FIG. 4 shows the addition of a spatial sound impression to a sound source.

FIG. 4 shows a possibility in which, in a positioning step 50, the sound sources are first arranged in the room, as was described for example with reference to FIG. 3*a* or 3*b*. Impulse responses are associated to the loudspeakers for each sound source.

Since the sound source is located in a defined spatial position with respect to the reproduction environment, a spatial sound impression can directly be imparted to the sound source when the latter is located in a spatial direction with respect to the reproduction environment for which a determined spatial sound impression should be simulated.

In this case, in a room-simulation step 52 an impulse-response function, which has to be transferred in a transfer step 54 to a reproduction system together with the sound source, is generated for each sound source and spatial direction, in order to achieve during the reproduction the desired spatial sound impression.

Figure 5:
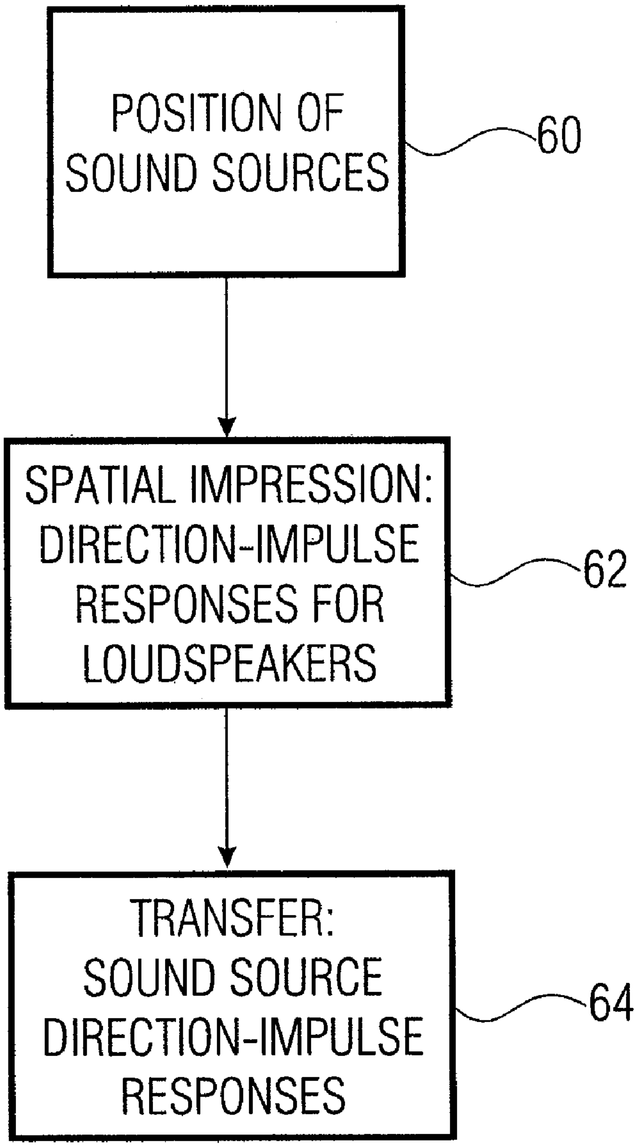
FIG. 5 shows the addition of a spatial sound impression to individual loudspeaker signals.

As shown in FIG. 5, it is alternatively also possible to first establish, in a positioning step 60, the position of the sound sources by generating for loudspeakers for each sound source impulse responses, which describe the position. The spatial impression, which should result in a listening direction, can, since the loudspeakers used in the reproduction system are also associated with fixed spatial directions, also be generated in that for each loudspeaker is in addition generated, in a room-simulation step 62, an impulse response, which contains the information regarding the space located in the direction of the loudspeaker.

In a transfer or storing step 64, the sound source must then transmit to the sound-reproduction system, for each individual loudspeaker, a position impulse response and a space impulse response. Thanks to the flexibility of the graphic user interface according to the invention, the association of a spatial sound impression can thus either occur to each sound source individually or groups of sound sources, which are arranged in a similar spatial direction with respect to the reproduction environment, can be grouped to represent several discrete spatial directions, whereby the necessary calculation capacity during the reproduction is reduced.

Figure 6:
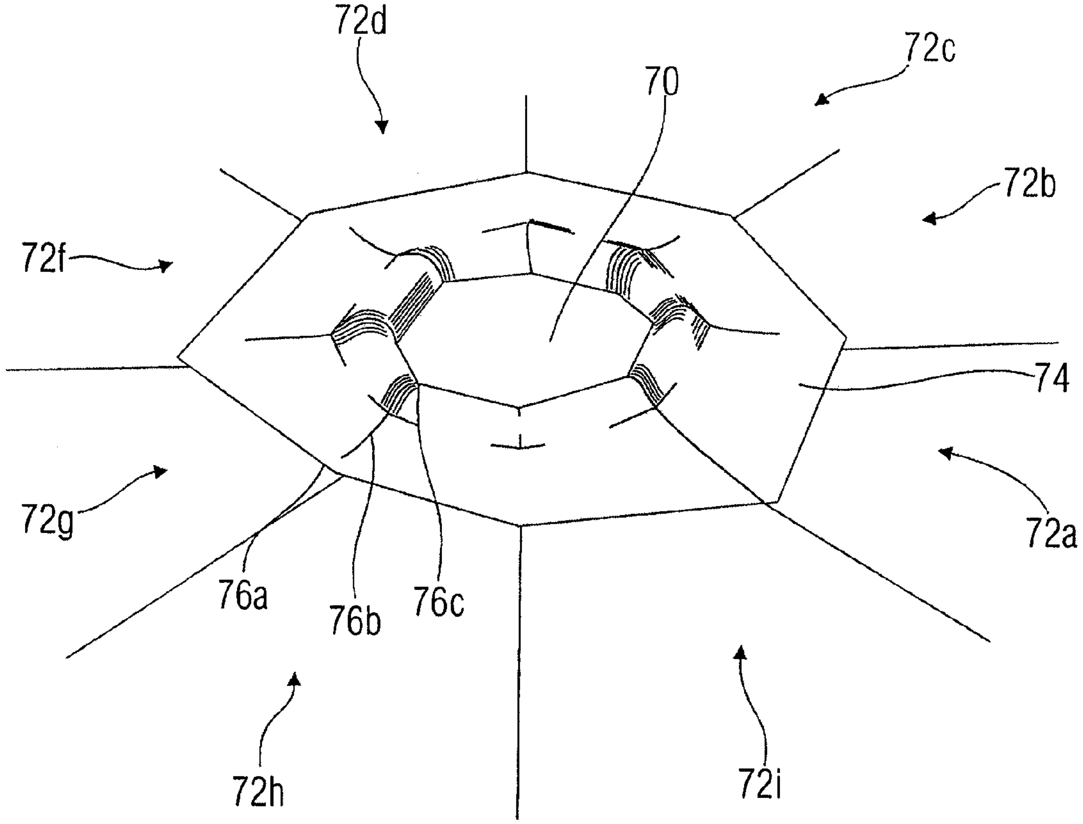
FIG. 6 shows a graphic user interface for displaying and modifying impulse responses.

An embodiment of the graphic user interface according to the invention, which shows the manipulation of an impulse response in a time representation of an impulse response, is shown in FIG. 6.

To this end, the spatial directions with respect to a reproduction environment 70 are divided into eight discrete sectors 72*a*-72*h*. For each of the sectors 72*a*-72*h* is thus obtained a common spatial impression by means of a time representation of the impulse response. For visualisation purposes, the envelopes of the eight impulse responses used for the room simulation are converted into surfaces. These surfaces are arranged in the form of an octagon and connected in order to form a common surface 74. The height of the surface corresponds over the surface defined by the sectors 72*a*-72*i* to the amplitude of the impulse response. The distance from the centre of the reproduction environment 70 represents the time, wherefore events occurring in time at the end of the impulse response are at a larger distance from the centre of the reproduction environment 70.

With this representation, the amplitude evolutions of the room impulse responses can be represented over the time according to their spatial direction. The change occurs interactively through moving interaction elements 76*a, b* and *c*, here represented by way of an example. It is thus possible to detect at a glance the whole spatial sound situation and to identify and eliminate deviations from the desired behaviour.

For example, for a real room, the reverberation time from all directions should, as a rule, be nearly identical. In the example shown in FIG. 6, the reverberation time toward the sector 72*h* is however reduced, which can easily be identified by the asymmetry of the total surface 74, so that the difference with respect to the uniformly reverberating real room can immediately be identified.

Figure 7:
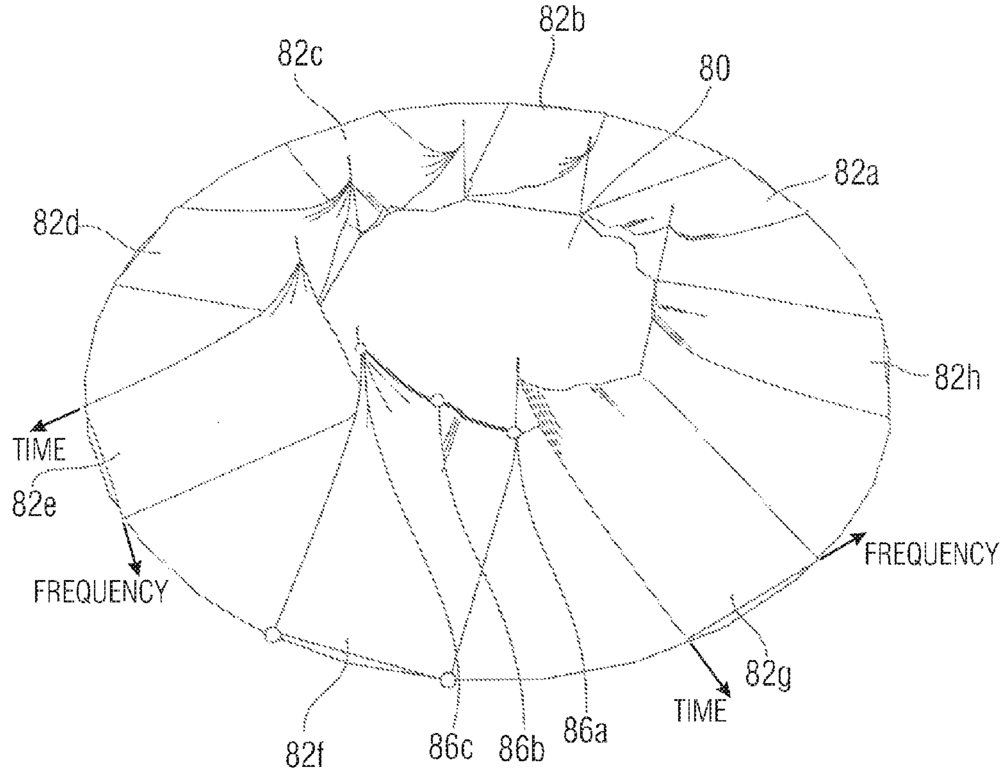
FIG. 7 shows a graphic user interface for displaying and modifying frequency-selective impulse responses.

FIG. 7 describes a representation of spatial impulse responses in a time-frequency representation. Shown are the reproduction environment 80 and eight time-frequency representations of impulse responses 82*a*-82*h*, which are associated with eight discrete spatial directions with respect to the reproduction environment 80.

With the exemplary embodiment according to the invention in FIG. 7, it is generally possible to visualise both the time and the frequency components of impulse responses related to their spatial directions and to make them capable of being manipulated. The time axis of the visualisation extends outwardly, starting from the centre of the reproduction environment 80, so that points at a greater distance describe later events. The eight surfaces 82*a*-82*h*, which represent the impulse responses in the form of a cascaded diagram, can be changed for example based on interaction elements 86*a*-86*c*. The interaction elements 86*a*-86*c* represented by way of an example permit the manipulation of the amplitude frequency response at a given time, in the example represented here thus at the beginning of the impulse response. In the case represented here, low frequencies are arranged to the left and high frequencies are arranged to the right, so that it can immediately be identified that in the spatial simulation the low frequencies start with higher amplitude and vanish during a longer period than the high frequencies. This complex relationship, which can be stored for example in the form of a matrix by describing the surfaces 82*a*-82*h*, should here be detected and changed intuitively.

The type of representation allows furthermore representing additional effects or identifying their effect, for example, in this representation, strong reflections from determined spatial directions would be visible as elevations on the surfaces of the corresponding spatial impulse response.

Thus, by observing simultaneously the time and frequency component, one can see the frequency portions that are reflected. Through shifting the interaction elements 86*a*-86*c* towards a corresponding location in the impulse response, this reflection can be processed both in time and in frequency, so that the large number of parameter on which the visualisation is based can be scanned and stored in a favourable and efficient way.

Figure 8:
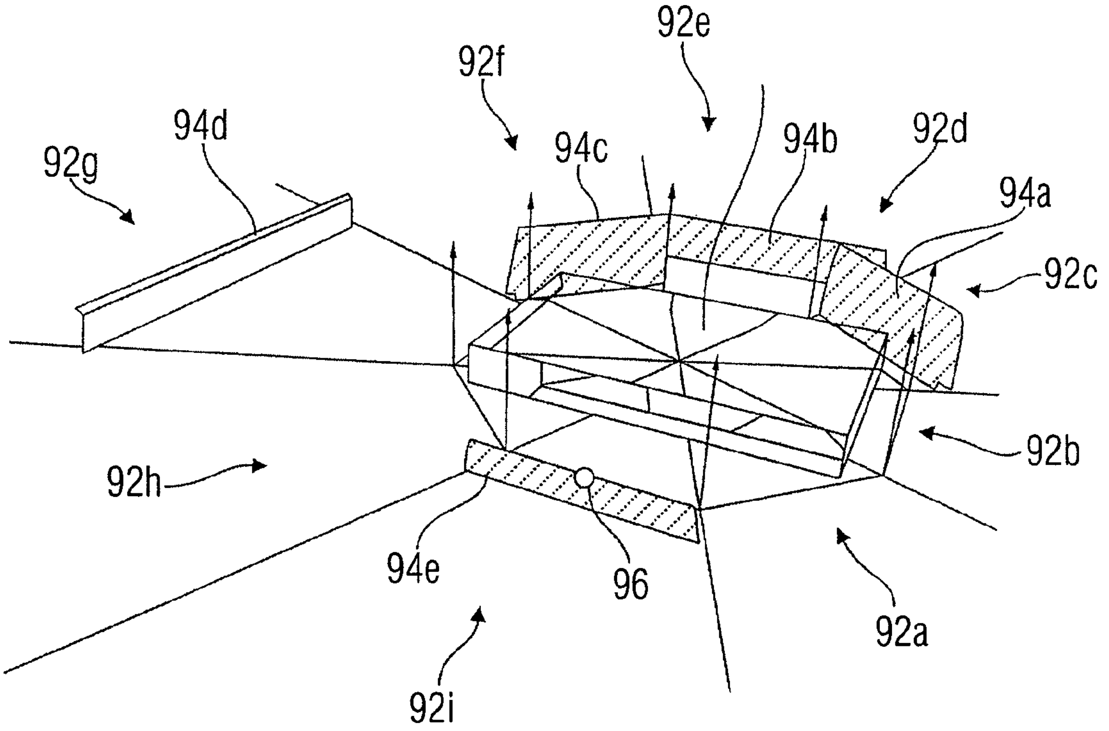
FIG. 8 shows a graphic user interface for displaying and modifying time delays for different spatial directions.

FIG. 8 shows another example of a graphic user interface according to the invention, in which the impulse responses of the individual spatial directions are comprised of discrete peaks. Shown are a reproduction environment 90, eight discrete spatial directions 92*a*-92*i* and five exemplary delta-shaped impulse responses 94*a*-94*e*.

Since peak- or delta-shaped impulse responses correspond to time delays of a sound signal, multi-tap delays depending on the direction can thus be created. The wave-fronts 94*a*-94*e* represent echoes from the spatial directions associated with same. Their distance to the centre of the reproduction volume indicates the time of the repetition of the original signal. According to the invention, the position of the repetitions can be affected for example by means of an interaction element 96 in the form of a sphere by radial movements of the impulse responses from or to the centre of the system. The amplitude of the repetitions can simultaneously be affected by the height of the wave-fronts in the vertical direction.

The advantage of the high intuitivity of the graphic user interface according to the invention is particularly clear here, since the position of the delta-shaped peaks describes the delay time of an echo, which is acoustically equivalent to a reflecting wall with a predetermined attenuation located at the position of the impulse responses.

In an extended variant of the graphic user interface according to the invention is also possible a time-frequency representation, in order to additionally impart an individual frequency response to each echo.

Figure 9:
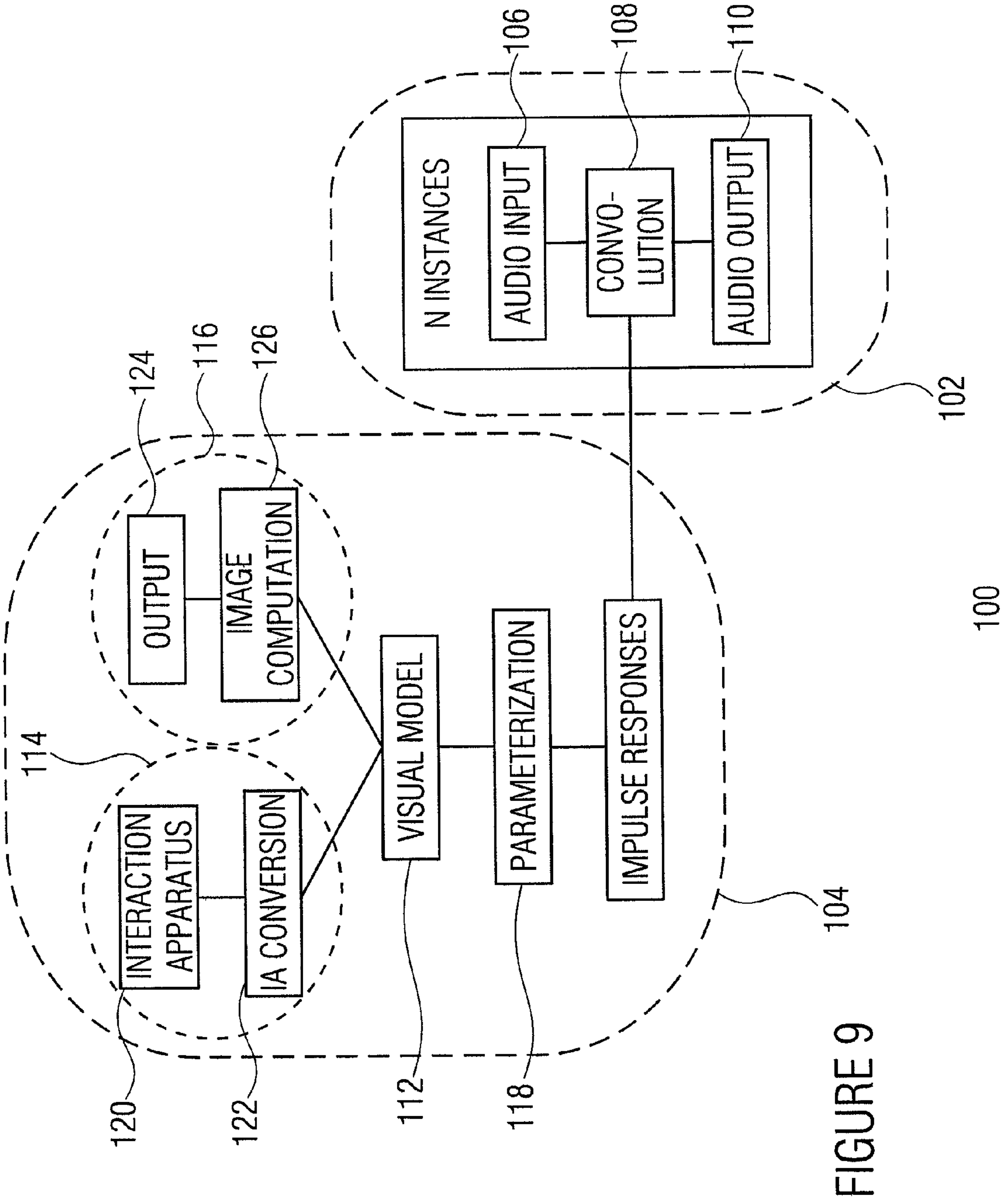
FIG. 9 shows a system for controlling a sound-reproduction system with a graphic user surface.

FIG. 9 describes a system for visualising and processing spatial sound effects 100, which is comprised of a signal processing part 102 and a visualisation and interaction part 104.

According to the invention, the signal processing consists in aliasing the incoming audio signals 106 by means of a mathematical aliasing 108 by which are aliased impulse responses determined by means of the visualisation and interaction part 104, in order to generate from the latter audio signals 110, which carry the sound impression of a room to be simulated. The visualisation and interaction part 104 has display means for displaying calculated impulse responses 112, means for receiving a user input of a change 114, means for allowing changing the graphical display 116 as well as means for detecting the changed impulse response 118. The means for receiving a user input of a change 114 includes an interaction device 120 as well as means for converting the interaction 122. The means for allowing changing the graphical display of the impulse response 116 includes output means 124 for representing the original impulse response as well as an image-calculation unit 126 for visualising the original impulse response.

The means for receiving a user input of a change and the means for allowing changing the graphical display of the impulse response 116 generate a visual model 112 based on parameters that describe the impulse responses and thus contain the information about the room to be simulated. If an adequate visual model was created by multiple interaction and visualisation, the means for detecting the changed impulse response 118 extracts the parameters on which is based the visualisation, and transmits them as impulse responses to the signal processing 102.

In an exemplary embodiment of the present invention, the signal processing includes the aliasing of N input signals with n impulse responses, in order to obtain n output signals. N can vary here from e.g. eight signals when generating Hall effects for the wave-field synthesis reproduction to a very large number when generating a whole wave-field. If several effects or sources are generated simultaneously, the output signals for each effect or each source must be added at the end.

The impulse responses needed for the signal processing are thus generated by means of the visualisation and interaction part of the system. From an impulse response can be generated sound-relevant parameters. One should distinguish whether spatial signals or direct signals are involved.

In the case of spatial signals, different methods can be used. The values obtained can then be graphically represented as described in the paragraph regarding the visualisation. The parameters can be changed and processed in order to obtain a new impulse response by means of the graphics and the incorporated interaction elements.

In the case of the positioning of direct sound, parameters can also be obtained from the interface. These can however only be converted into impulse responses for the loudspeaker channels by applying the wave-field synthesis algorithm. The parameters are thus at a more abstract level. This does however not change the structure of the block diagram in FIG. 9.

All the spatial sound effects from room simulation to multi-tap-delays can thus be visualised and edited by means of this system. This concept can be used in all conventional multi-channel systems up to the wave-field synthesis. It provides a universal solution method for spatial sound effects and their intuitive usability for the user.

As is made clear by the described exemplary embodiments, a substantial advantage of the graphic user interface according to the invention resides in that complex mathematical parameters are made accessible intuitively. This permits generating or adjusting these parameters, whereby in particular an eye can be kept at any time on the whole sound event. It is particularly advantageous that, in the described exemplary embodiments, which are based on 3D-visualisations, the direction in which the reproduction environment is considered can be varied, so that a resulting sound impression can be even better predicted since it is assessed from different spatial directions.

Although the graphic user interface has, in the representation in FIG. 1, individual discrete functional blocks, such a division should be understood only as an example, in principle, arbitrary combinations and groupings of the individual functional blocks are possible. Thus, the display means 12 can e.g. in an obvious way be combined with the means for allowing changing 14 the graphical display, as such is the case in part in the exemplary embodiments shown, wherein the possibility of modifying is already implemented as part of the display, for example in the form of the cursors 36*a* and 36*b* in FIG. 3*a* or 3*b*.

In the means for receiving a user input of a change can, in principle, also be contemplated methods other than those shown in the exemplary embodiments. The user input can occur by means of a mouse, a touch screen or any other possibility of moving a cursor on a screen. The direct input of discrete changing steps by means of a keyboard can also be represented, for example in a discrete representation of an impulse response, where the value of the impulse response can, in defined time periods, be set in discrete steps, which is easily possible for example by means of a conventional keyboard.

The representation of the wave-fronts or the impulse responses and the possibility of manipulating same are to be understood only as examples, any other suitable representation of impulse-response functions are also possible, in order to allow adjusting or generating a spatial impression according to the invention. For example, it could be contemplated, when considering different spatial directions, to represent a common impulse-response function that in some way predetermines the spatial basic character, which is thus identical for all spatial directions. A sound character depending on the direction could advantageously be represented in that for each spatial direction is represented only the difference with respect to the common impulse response function, so that one easily gets an impression of how the spatial direction considered differs, as to its spatial properties, from the total sound image (mean sound image).

A sequence of processing of the impulse-response functions, which describe the position of a sound source or the spatial impression, is not predetermined. It is possible to position first all sound sources in the room and to then generate a spatial impression as well as to first define the area to be simulated in order to then position the sound sources in the room.

Therefore, the processing steps for a system for controlling a sound-reproduction system, which has a graphic user interface according to the invention as well as a signal generator for providing loudspeaker signals, are different. On the one hand, it is possible to impart to each sound source that is present in a defined spatial direction room information through aliasing with a spatial impulse-response function, in order to then proceed, in a further step, individually for each loudspeaker to an aliasing with impulse responses, which describe the position of the sound sources with respect to the reproduction volume.

Alternatively, it is possible to first process the sound source individually for each loudspeaker, i.e. to generate individual loudspeaker signals through aliasing the sound signal with the impulse responses describing the position of the sound source, in order to then perform for the loudspeakers individually a further aliasing, which generates the spatial impression, the loudspeakers that are arranged in a fixed geometrical direction with respect to the reproduction environment being aliased with a spatial impulse response, which corresponds to the spatial impression to be simulated in direction of the loudspeakers.

The shape of the graphical elements, which are represented in the exemplary embodiments for visualising the individual essential components, such as the position of the sound source or the shape of an impulse response, are to be understood as exemplary embodiments, but the operation according to the invention is however also guaranteed when the type of geometrical representation differs as regards the shape, according to the application, a different shape could even have functional characters, i.e. describe different properties for example of a sound source.

The processing of signals, which is represented individually for each loudspeaker through aliasing a sound signal with an impulse-response function, can be implemented both continuously and discretely, alternative mathematical methods for imparting the spatial impression described by an impulse response to a sound signal being also possible.

In the exemplary embodiments shown above, the space surrounding the reproduction environment is, for generating a spatial impression, divided into eight discrete spatial directions, whereby a spatial sound character can be established individually for each spatial direction. This is to be understood only as an example, of course, any other numbers of spatial directions are possible, in principle, the number of the directions is not limited upwards, so that it is easily possible, according to the invention, to further improve the total sound impression.

According to the circumstances, the method according to the invention for applying a graphic user interface for using a sound-reproduction system can be implemented in hardware or in software. The implementation can occur on a digital storage medium, in particular a disk or a CD with electronically readable control signals, which can cooperate with a programmable computer system so that the method according to the invention for checking the success of a de-coring operation is performed. Generally, the invention thus also consists of a computer program product with a program code stored on a machine-readable carrier for performing the method according to the invention when the computer program product is executed on a computer. In other words, the invention can be thus be implemented as a computer program with a program code for performing the method when the computer program is executed on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A graphic user interface for a sound-reproduction system, which is formed so as to generate in a reproduction environment a spatial sound impression, comprising:

- a display configured for graphically displaying: an impulse response, which is associated with a spatial direction of the reproduction environment, the impulse response, relative to the reproduction environment, being represented in the spatial direction it is allocated to;
- an input device configured for allowing changing the graphical display of the impulse response by the user, a change of the graphical display of the impulse response being enabled at predetermined points of the graphical representation of the impulse response;
- a receiver configured for receiving a user input of a change, in order to graphically represent a changed impulse response by the display; and
- a detector configured for detecting the changed impulse response;

wherein the display is formed so as to graphically represent the impulse response as a function of the time and as a function of the frequency in a three-dimensional representation, the function values being represented as a height over a two-dimensional surface, one side of which comprises the time as a measure and a second side of which following the first side comprises the frequency as a measure.

2. The graphic user interface according to claim 1, wherein the display is formed so as to represent the time-dependent evolution of the impulse response such that same is divided into discrete time periods, an intensity value being associated with each time period.

3. The graphic user interface according to claim 1, wherein the display is formed so as to represent the frequency evolution of the impulse response such that same is divided into discrete frequency segments in which an intensity value being associated with each frequency segment.

4. The graphic user interface according to claim 1, wherein the input device for allowing changing the graphical display of the impulse response is formed so as to allow changing the graphical representation of the impulse response at any arbitrary point of the graphical representation of the impulse response.

5. The graphic user interface according to claim 1, wherein the input device for allowing changing the graphical display of the impulse response is formed so as to allow shifting the impulse response in the time as a change of the graphical display of the impulse response.

6. The graphic user interface according to claim 1, wherein the receiver for receiving a user input of a change is formed so as to receive signals of a computer mouse, a touch pad, a touch screen, a track ball or a keyboard.

7. The graphic user interface according to claim 1, wherein the detector for detecting the changed impulse response is formed so as to scan, for detecting, the changed impulse response graphically represented and to store the scanned values in a memory.

8. The graphic user interface according to claim 1, wherein the display is formed so as to graphically display an impulse response, which includes information about the position of a sound source with respect to the reproduction environment.

9. A graphic user interface for a sound-reproduction system, which is formed so as to generate in a reproduction environment a spatial sound impression, comprising:

- a display configured for graphically displaying: an impulse response, which is associated with a spatial direction of the reproduction environment, the impulse response, relative to the reproduction environment, being represented in the spatial direction it is allocated to;
- an input device configured for allowing changing the graphical display of the impulse response by the user, a change of the graphical display of the impulse response being enabled at predetermined points of the graphical representation of the impulse response;
- a receiver configured for receiving a user input of a change, in order to graphically represent a changed impulse response by the display; and
- a detector configured for detecting the changed impulse response;
- wherein the display is formed so as to display in addition a graphical representation of the reproduction environment in a three-dimensional representation, the impulse responses regarding the reproduction environment being represented in the spatial directions, which the impulse responses are associated with.

10. The graphic user interface according to claim 9, wherein the display is formed so as to graphically display an impulse response, which includes information about a space to be simulated.

11. A controlling apparatus for a sound-reproduction system, which is formed so as to generate a spatial sound impression in a reproduction environment, comprising:

- a graphic user interface for a sound-reproduction system, which is formed so as to generate in a reproduction environment a spatial sound impression, comprising:
- a display for graphically displaying an impulse response, which is associated with a spatial direction of the reproduction environment, the impulse response, relative to the reproduction environment, being represented in the spatial direction it is allocated to, wherein the display is formed so as to graphically represent the impulse response as a function of the time and as a function of the frequency in a three-dimensional representation, the function values being represented as a height over a two-dimensional surface, one side of which comprises the time as a measure and a second side of which following the first side comprises the frequency as a measure;

an input device for allowing changing the graphical display of the impulse response by the user, a change of the graphical display of the impulse response being enabled at predetermined points of the graphical representation of the impulse response;

a receiver for receiving a user input of a change, in order to graphically represent a changed impulse response by the display;

a detector for detecting the changed impulse response; and a signal generator for providing loudspeaker signals for loudspeakers of a plurality of loudspeakers that can be placed at different spatial positions.

12. The controlling apparatus according to claim 11, wherein the signal generator comprises a combiner for combining at least one sound signal with the changed impulse response, the sound signal being intended for a loudspeaker arranged at a spatial position corresponding to the spatial direction, which the impulse response is associated with, in order to achieve a loudspeaker signal, the combiner being formed so as to combine such that the loudspeaker signal includes the information about the space to be simulated.

13. The controlling apparatus according to claim 12, wherein the signal generator comprises a combiner for combining at least one sound signal with the changed impulse response, in order to achieve a loudspeaker signal, the combiner being formed so as to combine such that the loudspeaker signal includes the information about the relative position of a sound source associated with the sound signal.

14. The controlling apparatus according to claim 12, wherein the combiner is formed so as to alias, during the combination, the sound signal with the changed impulse response.

15. A method for using a sound-reproduction system, which is formed so as to generate a spatial sound impression in a reproduction environment, comprising:

graphically displaying an impulse response associated with a spatial direction of the reproduction environment, the impulse response, relative to the reproduction environment, being represented in the spatial direction it is allocated to, wherein the display is formed so as to graphically represent the impulse response as a function of the time and as a function of the frequency in a three-dimensional representation, the function values being represented as a height over a two-dimensional surface, one side of which comprises the time as a measure and a second side of which following the first side comprises the frequency as a measure;

allowing changing the graphical display of the impulse response by the user, a change of the graphical display of the impulse response being enabled at predetermined points;

receiving a user input of a change, in order to represent a changed impulse response; and detecting the changed impulse response.

16. A method for controlling a sound-reproduction system, comprising the method for using a sound-reproduction system, which is formed so as to generate a spatial sound impression in a reproduction environment, comprising:

graphically displaying an impulse response associated with a spatial direction of the reproduction environment, the impulse response, relative to the reproduction environment, being represented in the spatial direction it is allocated to, wherein the impulse response is presented as a function of the time and as a function of the frequency in a three-dimensional representation, the function values being represented as a height over a two-dimensional surface, one side of which comprises the time as a measure and a second side of which following the first side comprises the frequency as a measure; and allowing changing the graphical display of the impulse response by the user, a change of the graphical display of the impulse response being enabled at predetermined points of the graphical representation of the impulse response;

receiving a user input of a change, in order to represent a changed impulse response; and detecting the changed impulse response; and additionally comprising:

providing loudspeaker signals for a plurality of loudspeakers, which can be placed at different spatial positions based on the changed impulse response.

17. A non-transitory storage medium having stored thereon a computer program with a program code for performing, when the computer program is executed on a computer, a method for using a sound-reproduction system, which is formed so as to generate a spatial sound impression in a reproduction environment, the method comprising:

graphically displaying an impulse response associated with a spatial direction of the reproduction environment, the impulse response, relative to the reproduction environment, being represented in the spatial direction it is allocated to, wherein the impulse response is presented as a function of the time and as a function of the frequency in a three-dimensional representation, the function values being represented as a height over a two-dimensional surface, one side of which comprises the time as a measure and a second side of which following the first side comprises the frequency as a measure;

allowing changing the graphical display of the impulse response by the user, a change of the graphical display of the impulse response being enabled at predetermined points;

receiving a user input of a change, in order to represent a changed impulse response; and detecting the changed impulse response.

* * * * *